(12) United States Patent
Anand et al.

(10) Patent No.: US 6,411,089 B1
(45) Date of Patent: Jun. 25, 2002

(54) TWO-DIMENSIONAL PHASE-CONJUGATE SYMMETRY RECONSTRUCTION FOR 3D SPIN-WARP, ECHO-PLANAR AND ECHO-VOLUME MAGNETIC RESONANCE IMAGING

(75) Inventors: Christopher K. Anand, Chesterland; Paul M. Margosian, Lakewood; Francis H. Bearden, Twinsburg, all of OH (US)

(73) Assignee: Philips Medical Systems (Cleveland), Inc., Highland Heights, OH (US)

( * ) Notice: Subject to any disclaimer, the term of this patent is extended or adjusted under 35 U.S.C. 154(b) by 10 days.

(21) Appl. No.: 09/718,747

(22) Filed: Nov. 22, 2000

(51) Int. Cl.$^7$ ................................................. G01V 3/00
(52) U.S. Cl. ....................................... 324/309; 324/307
(58) Field of Search ................................. 324/309, 307, 324/306, 312, 314, 318, 322, 300

(56) References Cited

U.S. PATENT DOCUMENTS

| | | | |
|---|---|---|---|
| 4,678,996 A | 7/1987 | Haacke et al. | 324/309 |
| 4,833,407 A | 5/1989 | Holland et al. | 324/309 |
| 4,851,779 A | 7/1989 | DeMeester et al. | 324/312 |
| 4,912,413 A | 3/1990 | DeMeester et al. | 324/312 |
| 5,122,747 A | 6/1992 | Riederer et al. | 324/309 |
| 5,349,294 A | 9/1994 | Kasuboski | 324/309 |
| 5,502,384 A | 3/1996 | Nakaya et al. | 324/309 |
| 5,742,163 A * | 4/1998 | Liu et al. | 324/307 |
| 6,275,037 B1 * | 8/2001 | Harvey et al. | 324/307 |

OTHER PUBLICATIONS

"Chemical Shift Imaging Using Fast Gradient Echoes", Margosian, et al. SMRM 5th Annual Meeting, 1986, p. 834.
"Faster MR Imaging: Imaging with Half the Data", Margosian et al. Hlth Care Instrum. 1986, vol. 1, No. 6, p.195.
"Reconstruction Method for Incomplete k–Space Sampling", DeMeester, et al. SMRM, 1987, p. 804.
"Reducing MR Imaging Time By One–Sided Reconstruction" Cuppen, et al. Topical Conference on Fast MRI Techniques, Cleveland, OH, 1987.
"A Fast, Iterative, Partial–Fourier Technique Capable of Local Phase Recovery", Haacke, et al. J. Magn. Reson., 1991, 92 126–145.
"A Double Phase Correction/Hermetian Conjugation Procedure Improves the Quality of Half–Fourier Images", Purdy SMRM, 1987, p. 379.
"A Trimmed Image Method of Reconstructing Half–Fourier Images Having Severely Distorted Phases", Purdy SMRM, 1991, p. 742.

\* cited by examiner

*Primary Examiner*—Louis Arana
(74) *Attorney, Agent, or Firm*—Fay, Sharpe, Fagan, Minnich & McKee, LLP

(57) ABSTRACT

A non-rectangular central kernel (200, 400, 500) of magnetic resonance image data is collected and stored in an acquired data memory (44). A non-rectangular peripheral portion (210, 410, 510) of magnetic resonance image data adjacent the central kernel (200) is collected and stored in the acquired data memory (44). A phase correction data value set (54) is generated from at least a portion of the central and peripheral data value sets. A synthetic conjugately symmetric data set (220, 420, 520) is generated (60) from the peripheral data set and phase corrected (60) using the phase correction data value set (54). Unsampled corners of k-space are zero filled. The central, peripheral, and conjugately symmetric data sets are combined (80) to form a combined data set. The combined data'set is Fourier transformed (82) to form an intermediate image representation (84), which may be exported for display (90) or used for a further iteration. In this manner, a significant amount of data in a central region of k-space that contributes most strongly to the resultant image is collected while significantly reducing data acquisition time.

25 Claims, 6 Drawing Sheets

TWO-DIMENSIONAL PHASE-CONJUGATE SYMMETRY RECONSTRUCTION FOR 3D SPIN-WARP, ECHO-PLANAR AND ECHO-VOLUME MAGNETIC RESONANCE IMAGING

BACKGROUND OF THE INVENTION

The present invention relates to the magnetic resonance arts. It finds particular application in conjunction with Fourier transform or spin-warp imaging and will be described with particular reference thereto. It is to be appreciated, however, that the invention will also find application in conjunction with echo-planar imaging, echo-volume imaging, and other imaging and spectroscopy techniques in which only a partial or incomplete data set is available.

Conventionally, magnetic resonance imaging has included the sequential pulsing of radio frequency signals and magnetic field gradients across a region to be imaged. A patient is disposed in a region of interest in a substantially uniform main magnetic field. In two-dimensional imaging, an RF excitation pulse is applied as a slice select gradient is applied across the field to select a slice or other region of the patient to be imaged. A phase encode gradient is applied along one of the axes of the selected slice to encode material with a selected phase encoding. In each repetition of the pulse sequence, the phase encode gradient is stepped in regular intervals from a negative maximum phase encode gradient through a zero phase encode gradient to a positive maximum phase encode gradient. In three-dimensional volume imaging, a pair of phase encode gradients are applied along the two axes orthogonal to the read direction.

Because data lines on either side of the zero phase encode data lines are related to each other by conjugate symmetry, data acquisition time has been reduced by nearly one-half. In single slice imaging, one half of the data is collected, e.g., only the positive phase encode views or only the negative phase encode views, along with several lines adjacent to and on either side of the zero phase encode lines. The data lines near the zero phase encode data lines are used to generate a phase map for aligning the conjugately symmetric data. In three-dimensional imaging, the same concept is projected into the third dimension. A rectangle prism or thin slab of data is collected at the center of k-space to construct a phase map. Half of the remaining data is actually collected and conjugately symmetric data is used as the other half of the data.

Although faster than collecting all of the data lines, faster data acquisition times are in demand. The present invention contemplates a new and improved magnetic resonance imaging method which overcomes the above-referenced problems and others.

SUMMARY OF THE INVENTION

In accordance with one aspect of the present invention, a method of magnetic resonance imaging includes exciting magnetic resonance in an imaging region and causing a magnetic resonance echo during which a magnetic resonance echo signal is generated. A plurality of phase encode gradients are applied such that the resultant magnetic resonance echo signals are phase encoded in accordance with the phase encode gradients. A non-rectangular central portion of the magnetic resonance echo signal surrounding a central frequency is collected along with a non-rectangular side portion of the magnetic resonance signals between the central portion and one extreme of a resonance signal bandwidth. A phase correction data value set is generated from at least a portion of the central and side portion data value sets. In addition, a conjugately symmetric data value set is generated from at least a portion of the central and side portion data value sets. The conjugately symmetric data value set is phase corrected in accordance with the phase correction data value set. The central portion, side portion, and conjugately symmetric data value sets are combined to produce a combined data set which is transformed into an intermediate image representation.

In accordance with a more limited aspect of the present invention, the magnetic resonance imaging method includes either exporting the intermediate image representation to a human-viewable display or using the intermediate image representation in a further iteration to generate a second conjugately symmetric data set.

In accordance with another aspect of the present invention, a method of magnetic resonance imaging includes exciting magnetic resonance in an image region and inducing a magnetic resonance echo which generates magnetic resonance signals. The echo is phase and frequency encoded along an ellipsoidal central portion of k-space and along half of a peripheral region. An ellipsoidal central portion of k-space is sampled to create a central data set and a peripheral portion of k-space is sampled to create a peripheral data set. A phase correction data set is created from data values of at least one of the central data set and the peripheral data set. A conjugately symmetric data set is generated from at least one of the central and peripheral data sets. The conjugately symmetric data set is phase corrected in accordance with the phase correction data set. The central, peripheral, and conjugately symmetric data sets are combined to produce a combined data set, which is transformed to produce an image representation.

In accordance with another aspect of the present invention, a method of magnetic resonance imaging includes generating magnetic resonance data including a non-rectangular first set of centrally encoded data values and a non-rectangular second set of data values which includes less than one half of the remaining data values. A phase correction data set is created from data values of at least one of the first and second sets of data values. A conjugately symmetric third data set is generated from the second data set. The first, second, and third data value sets are Fourier transformed and phase corrected in accordance with the phase correction data set. The phase corrected, Fourier transformed data sets are combined to produce an image representation.

In accordance with another aspect of the present invention, a method of magnetic resonance imaging includes sampling a non-rectangular central region of k-space to generate a kernel data set and half-sampling a non-rectangular peripheral regions of k-space, with corners of k-space remaining unsampled, to generate an actually sampled peripheral data set. A symmetric data set is created from the actually sampled peripheral data set and the unsampled corners of k-space are zero filled. The kernel, actually sampled, and symmetric data sets are reconstructed into an image representation.

In accordance with another aspect of the present invention, a magnetic resonance imaging apparatus includes a magnetic resonance data means for generating a first non-rectangular set of centrally encoded data values and a second non-rectangular set of data values which includes less than one-half of the remaining data values. A phase correction generating means generates a phase correction value set from at least a portion of the first and second non-rectangular data value sets. A conjugate symmetry means generates a third non-rectangular data set from complex conjugate values of at least a portion of the first and second non-rectangular data value sets. A phase correcting means phase corrects the third non-rectangular data set in accordance with the phase correction value set. A combining means combines the first, second, and third non-rectangular data value sets to form a combined data set. A transform means transforms the combined data set into a resultant image representation.

One advantage of the present invention resides in reduced scan time.

Another advantage of the present invention is that it produces greater signal-to-noise ratio in the central portion of the scan.

Another advantage of the present invention resides in the elimination of susceptibility artifacts.

Another advantage of the present invention resides in the creation of a phase map focused in the region of primary interest.

Still another advantage of the present invention is that it applies phase conjugate symmetry in more than one dimension.

Other benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

FIGS. 1A and 1C, taken together, are a diagrammatic illustration of a magnetic resonance imaging (MRI) apparatus in accordance with an alternate embodiment of the present invention;

DETAILED DESCRIPTION OF THE PREFERRED EMBODIMENTS

Figure 1A:
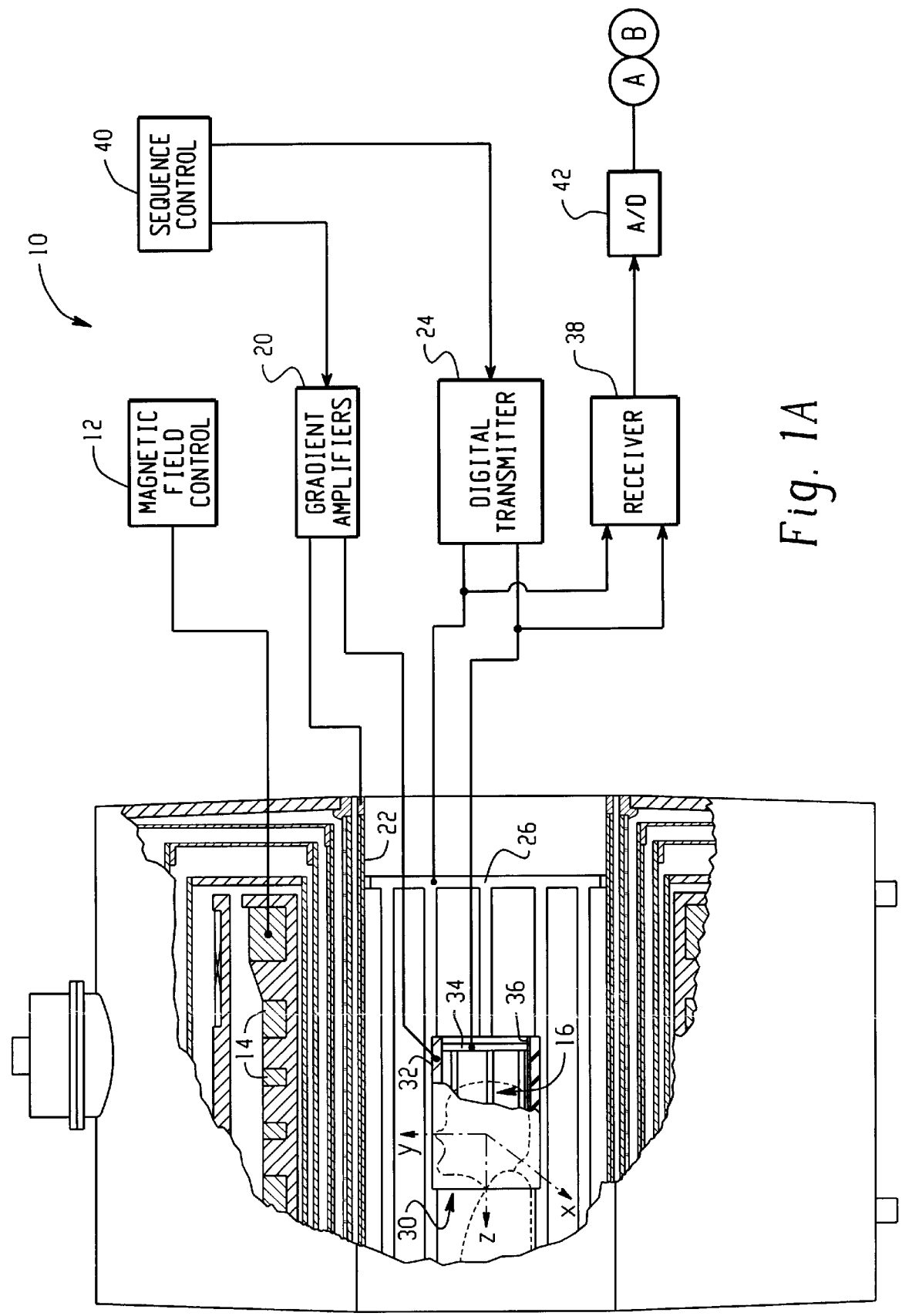
FIGS. 1A and 1B, taken together, are a diagrammatic illustration of a magnetic resonance imaging (MRI) apparatus in accordance with a preferred embodiment of the present invention.
Figure 1B:
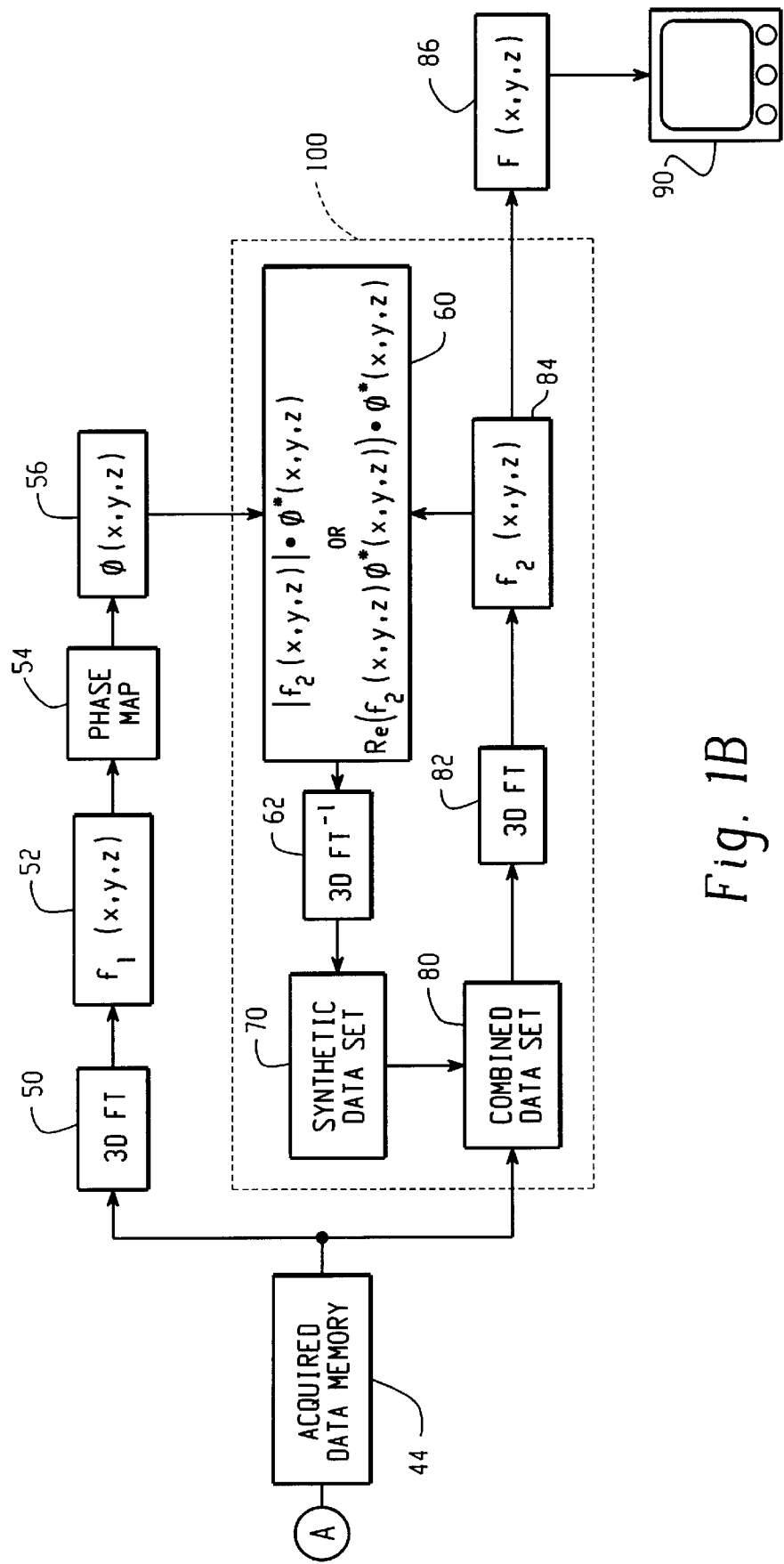

With reference to FIGS. 1A and 1B, a magnetic resonance imaging system includes a main magnetic field control 12 which controls superconducting or resistive magnets 14 such that a substantially uniform, temporally constant magnetic field is created along a z-axis through an examination or image region 16. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, saturate spins, and the like in order to generate magnetic resonance imaging and spectroscopy sequences.

More specifically, gradient pulse amplifiers 20 apply current pulses to selected ones or pairs of whole body gradient coils 22 to create magnetic field gradients along x, y, and z-axes of the examination region. In other words, by selectively applying current pulses to appropriate ones of the gradient field coils, slice select, phase encode, and read gradients are selectively applied along mutually orthogonal axes. In two-dimensional imaging, the slice select gradients define an image slice or region and the phase encode and read gradients encode the magnetic resonance along mutually orthogonal axes within the slice. In three-dimensional imaging, a pair of phase encode gradients are applied to step in a plane orthogonal to the read direction. A digital radio frequency transmitter 24 transmits radio frequency pulses or pulse packets to a whole-body RF coil 26 to transmit RF pulses into the examination region. The RF pulses are used to saturate spins, excite resonance, invert magnetization, refocus resonance, or manipulate resonance in selected portions of the examination region. The resonance signals are picked up by the whole-body RF coil 26.

To generate images of limited regions of the subject, local coils are placed contiguous to the selected region. For example, an insertable head coil 30 is inserted surrounding a selected brain region at the isocenter of the bore. The insertable head coil 30 includes local gradient coils 32 which receive current pulses from the gradient amplifiers 20 to create magnetic field gradients along x, y, and z-axes in the examination region within the head coil 30. A local radio frequency coil is used to excite magnetic resonance and receive magnetic resonance signals emanating from the patient's head. In one embodiment, the local coil is a surface or multiple loop array. Alternatively, a receive-only local radio frequency coil can be used to receive resonance signals induced by body-coil RF transmissions. An RF screen 36 blocks the RF signals from the RF head coil from inducing eddy currents in the gradient coils and surrounding structures. The resultant radio frequency signals are picked-up by the whole-body RF coil 26, the local RF coil 34, or other specialized RF coils and demodulated by a receiver 38.

A sequence control circuit 40 controls the gradient pulse amplifiers 20 and the transmitter 24 to generate any of a plurality of multiple echo sequences, including echo-planar imaging, echo-volume imaging, gradient and spin echo imaging, fast spin echo imaging, and the like. For the selected sequence, the receiver receives a plurality of data lines in rapid succession following each RF excitation pulse. Preferably, the receiver 38 is a digital receiver or, as shown in FIG. 1A, is accompanied by an analog-to-digital converter 42 for converting each data line into a digital format.

Referring again to FIGS. 1A and 1B, as each magnetic resonance signal .or echo is collected and/or sampled by the receiver 38 and analog-to-digital converter 42, the raw magnetic resonance data is loaded into an. acquired data memory 44 or memory matrix, otherwise known. as k-space. In other words, the acquisition of the magnetic resonance data is considered sampling of the three-dimensional k-space. Two of the dimensions, $k_y$ and $k_z$, are preferably sampled by applying different phase encoding gradients, $G_y$ and $G_z$, during each pulse sequence of the scan, and each acquired magnetic resonance signal contains multiple samples in the $k_x$ direction. The pulse sequence is repeated for as many repetitions as are necessary to sample all desired $k_y$ and $k_z$ values. As will be described more fully below, the three-dimensional k-space is sampled along a variety of trajectories, such as radial and spiral.

Figure 2:
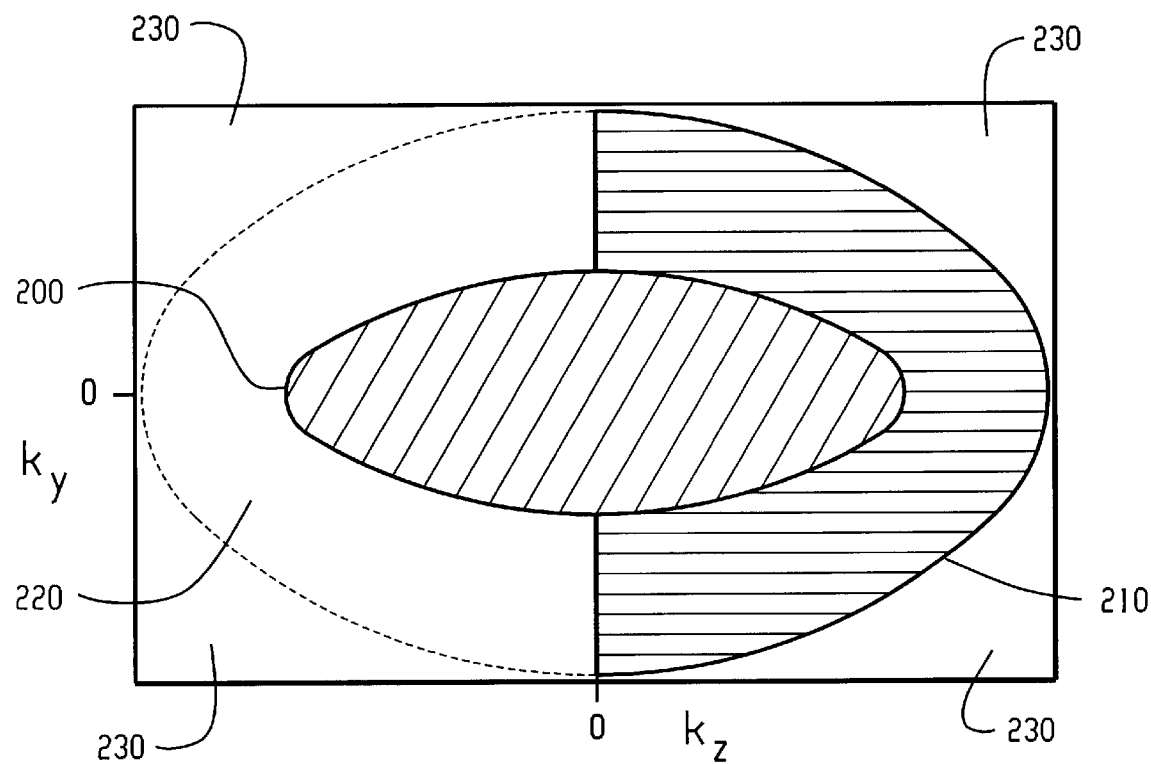
FIG. 2 is a graphical representation of a two-dimensional phase encode k-space plane to assist in conceptualizing the phase conjugate symmetry reconstruction technique in accordance with the present invention.

FIG. 2 is a graphical representation of a phase encode k-space plane which illustrates the preferred views used in a phase conjugate symmetry reconstruction employing multi-dimensional conjugate symmetry. A first magnetic resonance data set within a non-rectangular central portion or kernel 200 of centrally encoded views is collected on both sides of the zero or minimum phase encode gradient. In a preferred embodiment, the central kernel 200 is ellipsoidal in shape, with an aspect ratio approximating a human torso, head, or other organ of interest. However, it is to be appreciated that other non-rectangular central kernels, such as a circular central kernel, may be employed. A second magnetic resonance data set 210 is acquired adjacent the central kernel 200 which includes less than one-half of the remaining views. Preferably, the second or peripheral data set 210 is collected in a semi-ellipsoidal side or peripheral kernel adjacent the central ellipsoidal kernel, as shown in FIG. 2. In another embodiment, odd views can be collected on one side of the central kernel in a semi-ellipsoidal shape, and even views on the other side. Data is not collected in the corner regions 230 of the phase encode k-plane. In one embodiment, any data lines or portion of data lines in the corner regions 230 of the k-plane for which there is no data are filled with zeros.

In a preferred embodiment, data on the other side 220 of the central kernel 200 is not collected. As is described more fully below, the data in the other region 220 is synthesized from the symmetric properties of the magnetic resonance data. It is to be appreciated that collecting data in the k-space locations described above makes use of two-dimensional phase conjugate symmetry.

Figure 3:
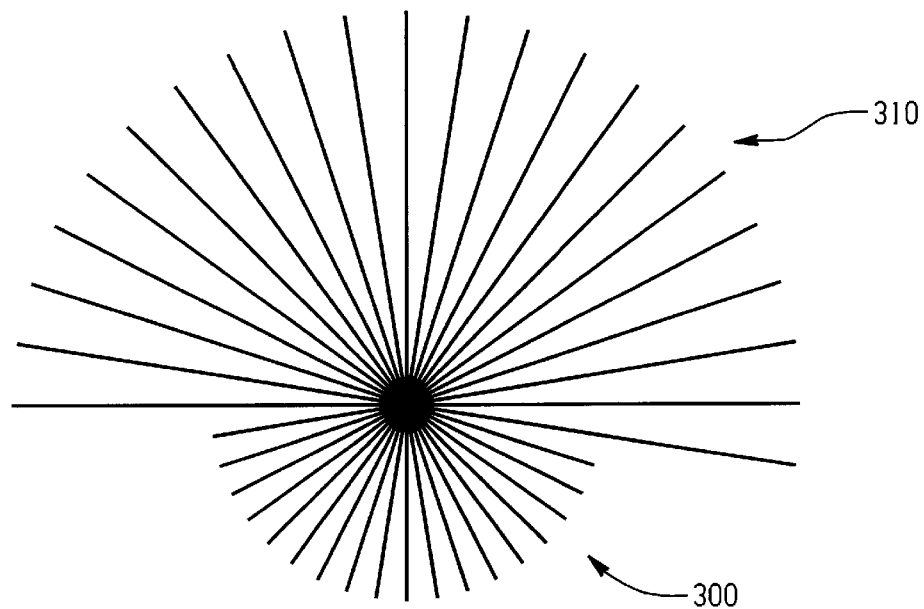
FIG. 3 is a graphical representation of one preferred k-space scan trajectory in accordance with the present invention.

With reference to FIG. 3 and continuing reference to FIG. 2, the two-dimensional phase conjugate symmetry reconstruction technique is amenable to a plurality of sampling trajectories through k-space. More particularly, the central kernel 200 and side or peripheral data set 210 may be acquired along a variety of k-space trajectories. In one embodiment for two- and three-dimensional "backprojection style" acquisitions, a central elliptical kernel is acquired along asymmetric, radial lines through the origin of k-space, as shown in FIG. 3. It is to be appreciated that in this embodiment, the central elliptical kernel is acquired as the first or last sample points in each shot in order to construct a two-dimensional phase map. As is described more fully below, the phase map is then used to reflect extra samples through the origin to produce symmetric samples in the unacquired portion of k-space. In this embodiment, it is to be appreciated that the central kernel is sampled at a first sampling density 300 and the peripheral data set is sampled at a second sampling density 310 that is one-half of the first sampling density. In other words, the efficiency of the reconstruction technique allows for oversampling of the more critical centrally encoded magnetic resonance data.

Figures 4A, 4B:
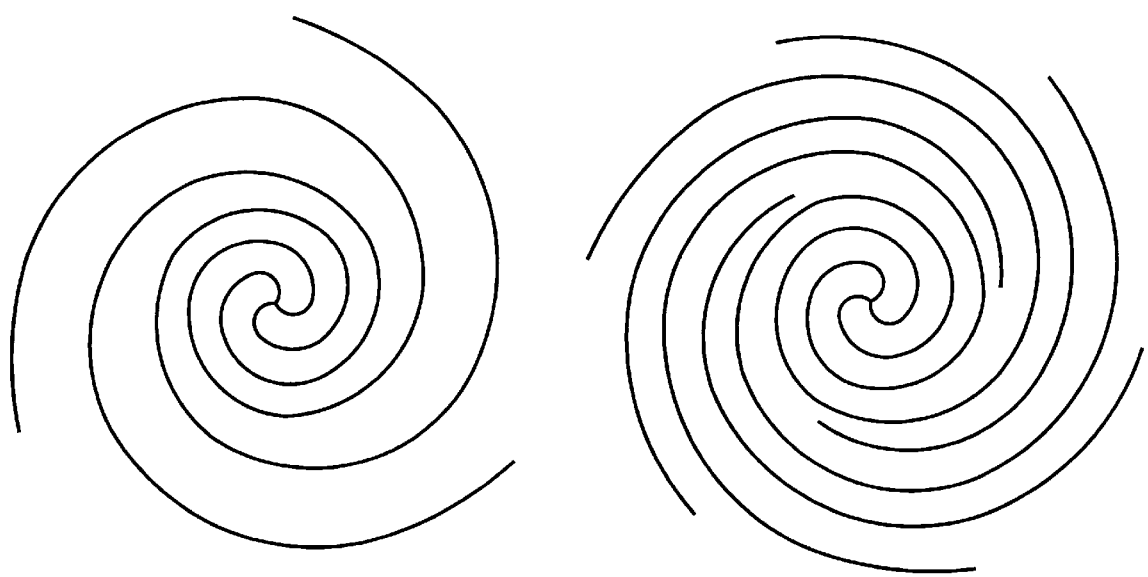
FIGS. 4A and 4B are graphical representations of other preferred k-space scan trajectories in accordance with the present invention.

In an alternate embodiment, a two- and three-dimensional single and multi-shot spiral k-space trajectory is employed, as shown in FIGS. 4A and 4B. It is to be appreciated that the present invention is also amenable to square. spiral trajectories, square interleaved spiral trajectories, conical trajectories, spherical, spherically spirally, octahedral, and other trajectories. through k-space. As shown in FIG. 4A, in the central kernel, the spiral expands at the rate required to produce the desired sampling resolution. Outside of the central kernel, the spiral arm doubles its rate of expansion, producing one-half of the first sampling density. For an odd number of shots, the outer portions of the spiral arms are reflected into the space between two other acquired arms, as shown in FIG. 4B. In the case of a single shot data acquisition, where there is only one arm, the reflected outer arm is sandwiched by the unreflected arm.

Figure 5:
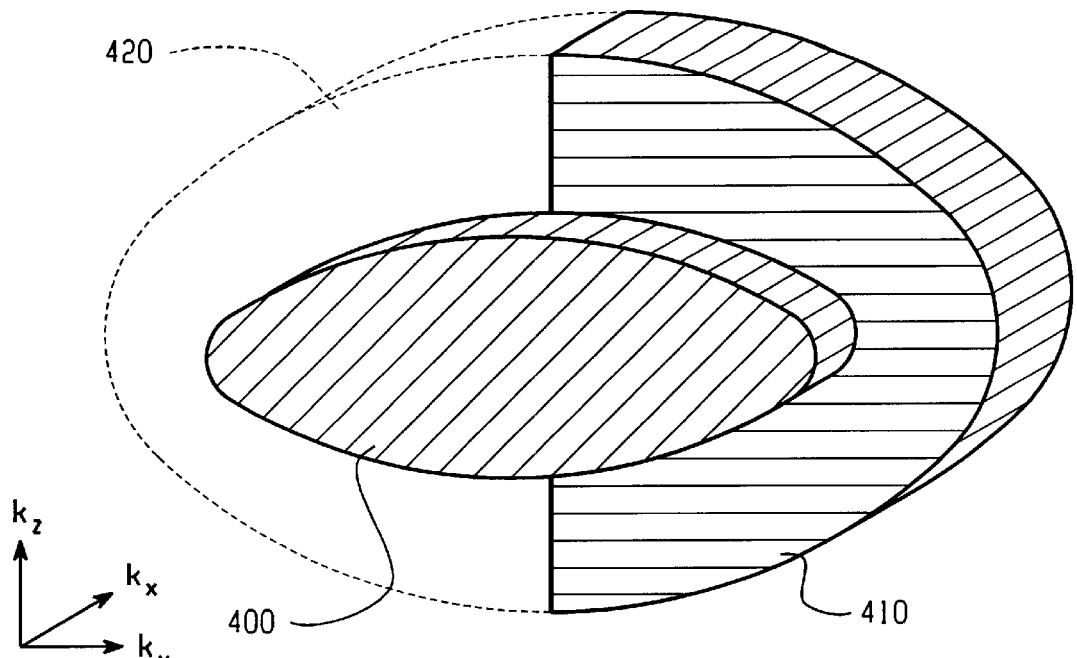
FIG. 5 is a graphical representation of a, three-dimensional eliptical slab in k-space to assist in conceptualizing the phase conjugate symmetry reconstruction technique in accordance with the present invention; and, FIG. 6 is a graphical representation of a three-dimensional spherical kernel in k-space to assist in conceptualizing the phase conjugate symmetry reconstruction technique in accordance with the present invention.

When performed in three dimensions, k-space, in one embodiment, is traversed in an elliptical slab, as illustrated in FIG. 5. A cylindrical kernel 400 in the center of k-space is fully sampled. A peripheral region is half sampled 410 and the remainder generated by conjugate symmetry 420.

Figure 6:
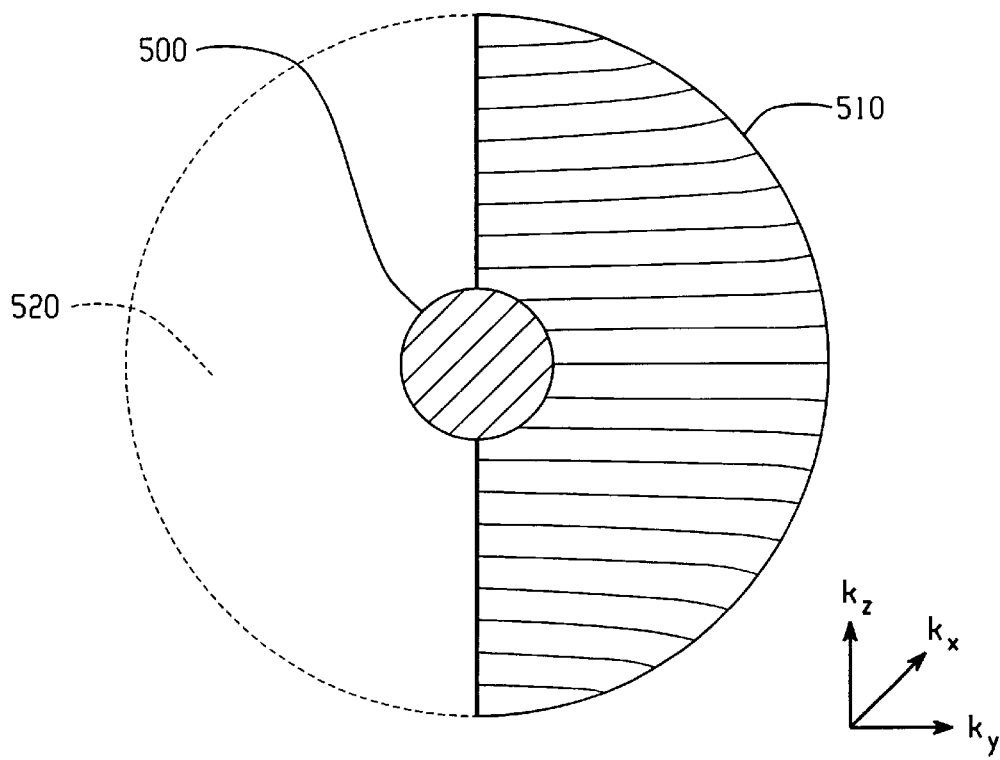

Alternately, a spherical or ovoid kernel 500 at the center of k-space is fully sampled, as illustrated in FIG. 6. A hemispherical surrounding region 510 is also sampled with a hemispherical region 520 being generated by conjugate symmetry.

The data for the central kernel are, in one embodiment, collected from early echoes of a multi-echo sequence and the peripheral data from the later echoes. Because the data near the center of k-space contributes most strongly to the resultant image, increasing the size of the central kernel increases image quality. For example, the first half of echoes may be used to generate the kernel. On the other hand, the smaller the kernel, the more quickly the peripheral data is collected. For example, only the first or a few of the early echoes of a 32 or 64-echo sequence can be assigned to the kernel. Of course, other echoes can be assigned to the kernel to adjust the contrast.

The above-referenced data acquisition techniques are carried out by conventional scan software. In one embodiment, the scan software begins with scan parameters that control primary and secondary phase encoding. These parameters include independent -primary and secondary resolution, fractional undersampling desired, and the fraction of samples that will contribute to the phase dimensions of the kernel. After the scan set-up is complete, the software computes a list of pairs of phase encode views through which to be stepped. The scan controller or sequence control 40 steps through the view. list, rather than counting through phase encode views in nested order. In one embodiment, a preliminary scan of the image region is performed in order to locate a concentration of NMR data values. From this preliminary scan, the shape of the central kernel may be tailored to the shape of the subject being imaged, providing an adaptive scanning application.

Referring again to FIGS. 1A and 1B, the incomplete data set described above in conjunction with FIG. 2, 7, or 8 is stored in the acquired data memory 44. A phase map correction processor 54 reconstructs a phase map equivalent phase correction data value set from the acquired data. In one embodiment, all of the actually acquired data contributes to the phase correction data value set. Alternately, only a portion of the incomplete data set, preferably the central kernel, contributes to the phase correction data value set.

The actually acquired data from the central portion and the side or peripheral portion of k-space, i.e. the lopsided data, is optionally filtered with a roll-off filter, such as a Hamming filter, to ramp down the data past zero in the central portion. Optionally, the unsampled portions or views of k-space are zero-filled. The filtered, zero-filled data is Fourier transformed by a three-dimensional Fourier transform 50 to form a first or acquired image representation $f_1(x,y,z)$ which is stored in a first image representation memory 52 Preferably, the image data is transformed by a series of one-dimensional Fourier transforms along orthongonal directions. The three-dimensional Fourier transform 50 constructs a first image, e.g. an array of complex data values. It is to be appreciated that the first image representation is a low-resolution image for internal use by the image reconstruction software. The first image is a "flawed" image in that it is reconstructed from limited k-space views and zero padding. As is described more fully below, the first image representation, $f_1(x,y,z)$, aids in the computation of phase correction values for use in an iterative phase conjugate symmetry reconstruction process to produce a composite image representation.

In one embodiment, the phase map correction processor 54 determines the phase of each of the complex data values of the first image matrix for storage in a phase correction memory 56. In one embodiment, the phase correction values stored in the phase correction memory 56 are determined by calculating the arctangent of the real and imaginary parts of each data value. Alternately, each first image complex data value is normalized such that it becomes a vector of unit length which is stored in the phase correction memory 56.

As is described more fully below, a data combiner 80 sums the acquired data from the acquired data memory 44 with synthetic or phase-conjugately symmetric data transferred from a synthetic data memory 70. Because no synthetic data is combined with the actual acquired data during the first iteration, the combined data set, which consists only of the actually acquired data, is zero-padded. The combined data set is Fourier transformed 82 into an intermediate image representation $f_2(x,y,z)$ for storage in an intermediate image memory 84. The intermediate image is a complex image in which each image data value is a complex number having a real and imaginary part. After each iteration, the intermediate image is either exported into a resultant image memory 86 as the resultant or composite image F(x,y,z) or it is transferred to a phase correction processor 60 for an additional iteration. Ultimately, the resultant image is exported to a display 90, such as a video monitor, which is operatively connected with the the resultant image memory 86 to display the resultant image. It is to be appreciated that the first intermediate image that is generated is "flawed" in that it does not include conjugately-symmetric synthetic data.

After the first iteration, a synthetic data set generating processor 60 generates a conjugately-symmetric synthetic image from the intermediate image representation $f_2(x,y,z)$ by taking the real part of the intermediate image representation and phase correcting it using corresponding phase correction values stored in the phase correction memory 56. A Fourier transform processor 62 performs an inverse, three-dimensional Fourier transform on the synthetic, creating a synthetic data set for storage in a synthetic data set memory 70.

In the second iteration, the synthetic data set is then combined with the actually acquired data, replacing the zero-padded views used in the first iteration. Optionally, for non-raster k-space trajectories, such as those illustrated in FIGS. 3, 4A, and 4B, the combiner 80 may take a weighted average of the synthetic and acquired data in generating the combined data set. The combined data set is three-dimensionally Fourier transformed 82 into another intermediate image representation for storage in the intermediate image memory 84. Preferably, the aforementioned iteration 100 is performed again before exporting the intermediate image representation 84 into the resultant image memory 86.

However, more than two iterations may be performed if desired. It is to be appreciated that with each iteration performed, the quality of the synthetic data set is improved.

As discussed above, for non-raster k-space trajectories, such as those illustrated in FIGS. 3, 4A, and 4B, the combiner 80 may take a weighted average of the synthetic and acquired data in generating the combined data set. The non-raster, k-space sampled data is conventionally resampled onto a lattice so that a fast Fourier transform may be applied. Each point sample is considered as a delta function in k-space. These point functions are convolved with a continuous bump function, such as the Kaiser-Bessel Kernel. The resulting continuous function is sampled on the lattice required by the Fourier transform.

In parallel, a sampling density is calculated by resampling a constant signal at the same k-space locations using the same convolution and resampling. The resampled data is then corrected for non-uniform sampling by dividing the resampled data pointwise by the sampling density. The result is transformed to produce an image representation.

In practice, k-space trajectories must be defined so that the sampling density does not get close to zero at any point. In dealing with the k-space trajectories illustrated in FIGS. 3, 4A, and 4B, the central portion of k-space is resampled, optionally correcting for non-uniform sampling. This central. data set is transformed and a phase map is formed from the central data. All samples are resampled to correct for non-uniform sampling in regions that are undersampled deliberately. In other words, a correction is performed for points that are oversampled, but not undersampled, using the average sampling calculated during the design of the k-space trajectory. The data is transformed to produce to obtain the intermediate image representation $f_2(x,y,z)$. This image is phase corrected as described above and inverse transformed to obtain the synthetic data.

The synthetic data is combined with the, resampled data by the following method. For points with a sampling density above a predetermined threshold, the resampled value is used. For points with a sampling density below the predetermined threshold, the following combination is used:

(resampled value)+[threshold−(actual sampling density)]*(synthetic value)

In this case, the threshold may be the mean, median, or other value determined from the sampling densities. As discussed above, the combined data is transformed to provide a new intermediate image representation, which may be exported for display or refined by a further iteration.

Figure 1C:
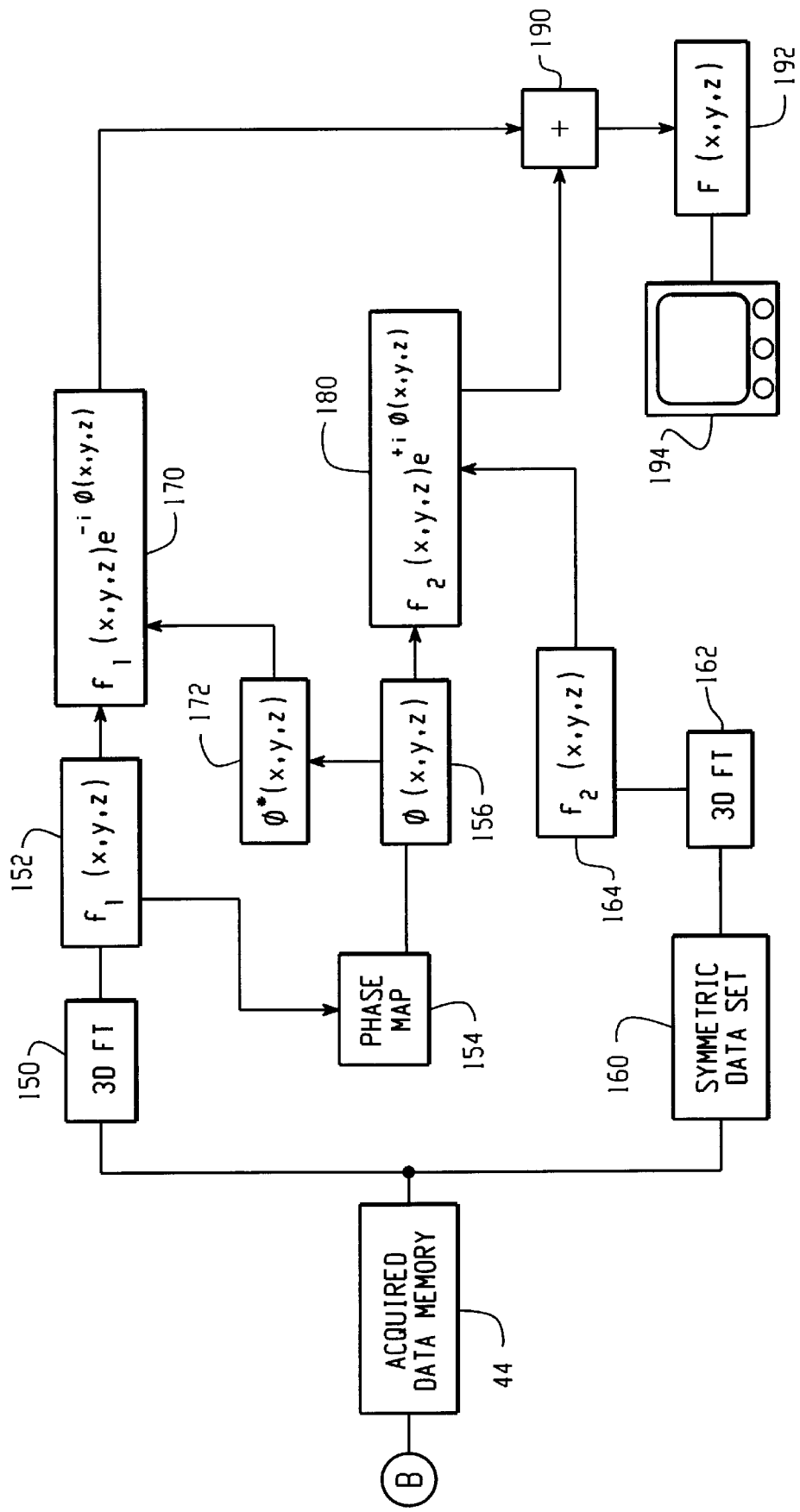

In an alternate embodiment, illustrated in FIG. 1C, the functions of the above iterative phase conjugate symmetry reconstruction may be implemented using a half-fourier imaging methodology.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A method of magnetic resonance imaging comprising:
   (a) exciting magnetic resonance in an image region;
   (b) after each excitation of magnetic resonance, causing a magnetic resonance echo during which a magnetic resonance echo signal is generated;

(c) applying a plurality of phase encode gradients such that the resultant magnetic resonance echo signals are phase encoded in accordance with the phase encode gradients;

(d) collecting a non-rectangular central portion of the magnetic resonance echo signal surrounding a central frequency;

(e) collecting a non-rectangular side portion of the magnetic resonance signals between the central portion and one extreme of a resonance signal bandwidth;

(f) generating a phase correction data value set from at least a portion of the central and side portion data value sets;

(g) generating a conjugately symmetric data value set from at least a portion of the central and side portion data value set;

(h) phase correcting the conjugately symmetric data value set in accordance with the phase correction data value set;

(i) combining the central portion, side portion, and conjugately symmetric data value sets to produce a combined data set; and, (j) transforming the combined data set into an intermediate image representation.

2. The method of magnetic resonance imaging according to claim 1, said method further comprising:
one of (i) exporting the intermediate image representation to a human-viewable display; and (ii) repeating steps (g), (h), (i), and (j) using the intermediate image representation to generate a second conjugately symmetric data set.

3. The method of magnetic resonance imaging according to claim 1, wherein the central portion is ellipsoidal in shape, and the side portion is semi-ellipsoidal in shape.

4. The method of magnetic resonance imaging according to claim 1, wherein the central portion data value set is collected at a first sampling density, and the side portion data value set is collected at a second sampling density, where the first sampling density is at least twice the second sampling density.

5. The method of magnetic resonance imaging according to claim 1, wherein step (f) includes centering, aligning, and combining the data values of the central and side portion data value sets.

6. The method of magnetic resonance imaging according to claim 1, wherein steps (c), (d), and (e) are performed such that the location of successive samples in a two-dimensional, phase-encode k-space plane form a spiral trajectory surrounding the origin of the k-space plane.

7. The method of magnetic resonance imaging according to claim 6, wherein step (i) includes taking a weighted average of the conjugately symmetric data value set and the central and side portion data value sets.

8. The method of magnetic resonance imaging according to claim 1, wherein steps (c), (d), and (e) are performed such that the central portion and side portion data is sampled along a plurality of radial lines passing through the origin of a two-dimensional, phase encode k-space plane.

9. The method of magnetic resonance imaging according to claim 8, wherein step (i) includes taking a weighted average of the conjugately symmetric data value set and the central and side portion data value sets.

10. The method of magnetic resonance imaging according to claim 1, further including:
performing a preliminary NMR scan of the image region in order to locate a concentration of NMR data values; and, determining the shape of the central portion and side portion of data values based on the located concentration.

11. A method of magnetic resonance imaging comprising:
(a) exciting magnetic resonance in an image region;
(b) inducing a magnetic resonance echo, said echo generating magnetic resonance signals;
(c) phase and frequency encoding the echo along an ellipsoidal central portion of k-space and along half a peripheral ellipsoidal region;
(d) sampling an ellipsoidal central portion of k-space to create a central data set;
(e) sampling a peripheral portion of k-space to create a peripheral data set;
(f) creating a phase correction data set from data values of at least one of the central data set and the peripheral data set;
(g) generating a conjugately symmetric data set from at least one of the central data set and the peripheral data set;
(h) phase correcting the conjugately symmetric data set in accordance with the phase correction data set;
(i) combining the central, peripheral, and conjugately symmetric data sets to produce a combined data set; and
(h) transforming the combined data set to produce an image representation.

12. The method of magnetic resonance imaging according to claim 11, wherein the central portion of k-space is one of (i) an oval cylinder and (ii) an ovoid.

13. The method of magnetic resonance imaging according to claim 11, wherein the central and peripheral portions of k-space are sampled along a spiral trajectory beginning at the k-space origin and moving outward therefrom.

14. The method of magnetic resonance imaging according to claim 11, wherein the central and peripheral portions of k-space are sampled along a plurality of radial lines passing through k-space origin.

15. A method of magnetic resonance imaging comprising:
(a) generating magnetic resonance data including a non-rectangular first set of centrally encoded data values and a non-rectangular second set of data values which includes less than one half of the remaining data values;
(b) creating a phase correction data set from data values of at least one of the first and second sets of data values;
(c) generating a conjugately symmetric third data set from the first and second data sets;
(d) Fourier transforming the first, second, and third data value sets;
(e) phase correcting at least one of the Fourier transformed first, second, and third data value sets in accordance with the phase correction data set; and,
(f) combining the phase corrected, Fourier transformed data sets to produce an image representation.

16. The method of magnetic resonance imaging according to claim 15, wherein the first set of data values is ellipsoidal in shape, and the second set of data values is semi-ellipsoidal in shape.

17. The method of magnetic resonance imaging according to claim 16, wherein the first set of data values is collected at a first sampling density, and the second set of data values is collected at a second sampling density, where the first sampling density is twice the second sampling density.

18. The method of magnetic resonance imaging according to claim 15, wherein step (a) is performed such that the first and second data value sets are sampled along a plurality of radial lines passing through the origin of a two-dimensional, phase encode k-space plane.

19. The method of magnetic resonance imaging according to claim 15, wherein step (a) is performed such that the first and second data value sets are sampled along a plurality of spiral trajectories surrounding the origin of a two-dimensional, phase encode k-space plane.

20. The method of magnetic resonance imaging according to claim 15, further including:

performing a preliminary MR scan of the image region; and, determining the shape of the first and second sets of data values based on the concentration of NMR data from the preliminary scan.

21. A method of magnetic resonance imaging comprising:

sampling a non-rectangular central region of k-space to generate a kernel data set;

half-sampling a non-rectangular peripheral region of k-space with corners of k-space remaining unsampled to generate an actually sampled peripheral data set;

creating a symmetric data set from the actually sampled peripheral data set;

zero-filling the unsampled corners of k-space;

reconstructing the kernel, actually sampled, and symmetric data sets into an image representation.

22. The method of magnetic resonance imaging according to claim 21, wherein the sampling follows one of a spiral trajectory, a spherically spiral trajectory, a cylindrically spiral trajectory, a conical trajectory, radial trajectories, an octahedral trajectory and a spherical trajectory.

23. A magnetic resonance imaging apparatus comprising:

magnetic resonance data means for generating a first non-rectangular set of centrally encoded data values and a second non-rectangular set of data values which includes less than one-half of the remaining data values;

a phase correction generating means for generating a phase correction value set from at least a portion of the first and second non-rectangular data value sets;

a conjugate symmetry means for generating a third non-rectangular data set from complex conjugate values of at least a portion of the first and second non-rectangular data value sets;

a phase correcting means for phase correcting the third non-rectangular data set in accordance with the phase correction value set;

a combining means for combining the first, second, and third non-rectangular data sets to form a combined data set; and, a transform means for transforming the combined data set into a resultant image representation.

24. The magnetic resonance imaging apparatus according to claim 23, wherein the magnetic resonance data generating means includes:

means for exciting magnetic resonance of dipoles in an image region;

means for inducing magnetic resonance echoes during which magnetic resonance echo signals are generated;

means for applying magnetic field gradients across the image region for phase encoding the magnetic resonance signals; and, an analog-to-digital converter for digitizing the magnetic resonance echo signals to create digital sets of data values.

25. The magnetic resonance imaging apparatus according to claim 23, wherein the generated first non-rectangular set of centrally encoded data values are ellipsoidal in shape, and the second non-rectangular set of data values is semi-ellipsoidal in shape.

\* \* \* \* \*